(12) United States Patent
Dynes et al.

(10) Patent No.: US 9,653,309 B2
(45) Date of Patent: May 16, 2017

(54) METHOD FOR FABRICATION OF HIGH ASPECT RATIO TRENCHES AND FORMATION OF NANOSCALE FEATURES THEREFROM

(71) Applicant: THE REGENTS OF THE UNIVERSITY OF CALIFORNIA, Oakland, CA (US)

(72) Inventors: Robert C. Dynes, La Jolla, CA (US); Peter Roediger, San Diego, CA (US); Travis Wong, San Diego, CA (US); Shane A. Cybart, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 36 days.

(21) Appl. No.: 14/403,550

(22) PCT Filed: May 24, 2013

(86) PCT No.: PCT/US2013/042766
§ 371 (c)(1),
(2) Date: Nov. 24, 2014

(87) PCT Pub. No.: WO2013/177576
PCT Pub. Date: Nov. 28, 2013

(65) Prior Publication Data
US 2015/0118604 A1    Apr. 30, 2015

Related U.S. Application Data

(60) Provisional application No. 61/651,898, filed on May 25, 2012.

(51) Int. Cl.
*H01L 21/3065* (2006.01)
*H01L 21/302* (2006.01)
(Continued)

(52) U.S. Cl.
CPC ...... *H01L 21/3065* (2013.01); *B81C 1/00031* (2013.01); *B81C 1/00103* (2013.01);
(Continued)

(58) Field of Classification Search
None
See application file for complete search history.

(56) References Cited

U.S. PATENT DOCUMENTS 4,169,009 A * 9/1979 Wagner .............. G02B 6/12004
204/192.34
4,309,267 A    1/1982 Boyd et al.
(Continued)

FOREIGN PATENT DOCUMENTS

JP    4564272 B2    10/2010

OTHER PUBLICATIONS

T. Takamori et al., Appl. Phys. Lett., vol. 53, year 1988, pp. 2549-2551.*
(Continued)

*Primary Examiner* — Jiong-Ping Lu
(74) *Attorney, Agent, or Firm* — Eleanor Musick; Musick Davison LLP (57) ABSTRACT

A process for forming trenches in a target material includes forming a masking layer onto the target material, where the masking layer comprises a material having high selectivity to a plasma etch gas adapted for etching the target material. A pattern is formed in the masking layer to expose portions of the target material and the sample is placed on an angle mount at a pre-determined angle relative to a cathode of a reactive ion etcher so that the target material is within a plasma dark space of the plasma etch gas. Ballistic ions within the plasma dark space form a trench structure within the target material. The process may further include repeating the steps of positioning the sample and etching the exposed portions of the target material with the substrate at a different angle to define a triangular structure.

26 Claims, 7 Drawing Sheets

(51) Int. Cl.
| | |
|---|---|
| H01L 21/308 | (2006.01) |
| H01J 37/20 | (2006.01) |
| H01J 37/305 | (2006.01) |
| H01J 37/34 | (2006.01) |
| B81C 1/00 | (2006.01) |
| G01R 33/00 | (2006.01) |
| G03F 1/80 | (2012.01) |
| G03F 7/09 | (2006.01) |
| H01L 21/311 | (2006.01) |

(52) U.S. Cl.
 CPC .......... *G01R 33/0052* (2013.01); *G03F 1/80* (2013.01); *H01J 37/20* (2013.01); *H01J 37/3056* (2013.01); *H01J 37/34* (2013.01); *H01L 21/302* (2013.01); *H01L 21/308* (2013.01); *H01L 21/31116* (2013.01); *B81B 2203/033* (2013.01); *B81C 2201/0132* (2013.01); *G03F 7/094* (2013.01); *H01L 21/31138* (2013.01)

(56) References Cited

U.S. PATENT DOCUMENTS

| | | | |
|---|---|---|---|
| 5,111,491 A * | 5/1992 | Imai | G03F 1/22 378/210 |
| 2005/0205872 A1 | 9/2005 | Hallin et al. | |
| 2006/0166506 A1 | 7/2006 | Okawa et al. | |
| 2008/0254627 A1 | 10/2008 | Wells | |
| 2009/0174067 A1 * | 7/2009 | Lin | H01L 21/76808 257/734 |
| 2009/0273010 A1 * | 11/2009 | Simoen | H01L 21/3228 257/288 |
| 2012/0225557 A1 | 9/2012 | Serry et al. | |

OTHER PUBLICATIONS

P.L.G. Ventzek et al., Handbook of Semiconductor Manufacturing Technology, 2nd ed. Edited by R. Doering and Y. Nishi, CRC Press, year 2007, chapter 21.*

Cybart, Shane A. et al., Nanometer scale high-aspect-ratio trench etching at controllable angles using ballistic reactive ion etching. J. Vac. Sci. Technol. B 31(1), Jan./Feb. 2013 010604-1-4.

International Search Report & Written Opinion issued for PCT/US2013/042766 mailed on Sep. 19, 2013, 9 pages.

Cybart, Shane A. et al., Very large scale integration of nanopatterned $YBa_2Cu_3O_7$-$\delta$ Josephson Junctions in a Two-Dimensional Array, Nano Letters 2009 vol. 9, No. 10 3581-3585.

Ayon, A.A., et al., "Tailoring etch directionality in a deep reactive ion etching tool," J. Vac. Sci. Technol. B, May 2000, 18(3): 1412-1416.

Roediger, et al., "Fabrication of arrays of nano-superconducting quantum interference devices using a double-angle processing approach," IEEE Transactions on Applied Superconductivity, vol. 23, No. 3, Part 1, Jun. 2013, Article No. 1100604-1-4.

* cited by examiner

METHOD FOR FABRICATION OF HIGH ASPECT RATIO TRENCHES AND FORMATION OF NANOSCALE FEATURES THEREFROM

RELATED APPLICATIONS

The present application claims the benefit of the priority of U.S. Provisional Application No. 61/651,898, filed May 25, 2012, which is incorporated herein by reference in its entirety.

FIELD OF THE INVENTION

The present invention relates to a method for creating masks allowing for high aspect ratio nanometer-scale features and doping profiles.

BACKGROUND OF THE INVENTION

As the dimensions of semiconductor devices decrease, it is becoming increasingly difficult and expensive to fabricate nanoscale features and precisely control dopants at the nanoscale level. A great deal of research has been devoted to extending the capabilities of UV lithograph due to its high throughput for manufacturing as compared to direct-write processes such as electron beam lithography. Modern UV lithography machines are rapidly approaching the limits of the smallest features possible, and alternative methods are required to achieve reproducible nanoscale features and doping profiles. Retrograde doping in MOS-FET devices to reduce short channel effects and graded base doping in bipolar junction transistors for reduction of base transit times are two examples of the importance of nanoscale impurity doping.

One method to achieve nanoscale structures and precision of homogeneous implants is to use high aspect ratio structures etched into resist at an angle to the substrate to serve as implantation masks. The high aspect ratio of these masks reduces lateral ion straggle and helps keep the implanted profiles sharp and well-defined. For gradient doping, thermal diffusion is typically used to grade the profile which, in practice, is difficult to precisely control at the nanoscale level.

The growing number of applications for superconductor quantum interference devices (SQUIDs) such as quantum computing and low noise amplifiers is also driving the need for more economical fabrication processes. To provide an example, the use of step-edge junctions are known to provide increased device yield and enable fabrication of complex circuits including microbridge junctions. Step-edge junctions are generally patterned using standard lithography followed by Argon ion milling, which is performed at an angle relative to the substrate plane to achieve the desired step angle. Depending on the substrate material, the formation of angled step edges is non-trivial due to the erosion of the mask material during the milling process, resulting in shallow step-edge profiles. As a result, standard lithography processes are frequently inadequate. One approach to solving this problem is described in U.S. Patent Publication No. 2004/0023434 of Venkatesan et al., which involves the use of a shadow mask with an overhang structure during ion milling. The overhang is formed using photoresist that is treated by intermixing curing steps with chlorobenzene treatments.

Reactive ion etching (RIE) is an established and widely used technique to selectively remove material from a surface. RIE is typically used in conjunction with a lithographically-patterned resist spun onto the sample surface in order to transfer the pattern into the substrate. A large number of variables consisting of types of gases used and plasma power enable RIE to be adapted to a wide range of applications in science as well as in the semiconductor industry.

The incident ions accelerated in the plasma are typically directed perpendicular to the sample surface, which, while providing for the formation of features with vertical sidewalls, makes any attempt to perform RIE at a non-perpendicular angle to the surface difficult. A few papers have been published describing the use of more or less complicated sample holders or faraday cages with the goal of placing the substrate inside the plasma dark space. As the ballistic transport of ions in the dark space ensures a high directionality, a tilted surface located inside this dark space will continue to be etched perpendicular to the cathode (typically the RIE sample holder), resulting in inclined sidewalls. Some publications report efforts to perform angled etching of substrates, however, these approaches typically include complicated sample holders that are limited to either small samples, or fixed angles. In addition, the described processes may not be used to create high aspect-ratio implant masks. Examples of publications on this subject include: B. Jacobs, R. Zengerle, "Reactive ion etching of sloped sidewalls for surface emitting structures using a shadow mask technique" (1996), *J. Vac. Sci. Technol. B*, 14(4), 2537-2542; R. W. Tjerkstra, L. A. Woldering, et al, "Method to pattern etch masks in two inclined planes for three-dimensional nano- and microfabrication" (2011), *J. Vac. Sci. Technol. B*, 29(6), 061604; T. Takamori, L. A. Coldren, J. L. Merz, "Angled etching of GaAs/AlGaAs by conventional $Cl_2$ reactive Ion Etching", (1988), *Appl. Phys. Lett.* 53 (25), 2549-2551.

The need remains for a method for creating masks that can be used to produce nanoscale features, such as doping profiles with arbitrary angles, MEMS, SQUIDs and other devices using conventional lithography processes. The present invention is directed to such a need.

SUMMARY OF THE INVENTION

The inventive process provides for the creation of high-aspect ratio nanometric canyons at an arbitrary angle to the substrate using conventional lithography methods and reactive ion etching. The aspect ratio that can be achieved is on the order of 20:1 or greater. This technique can be employed to create periodic three-dimensional photomasks to achieve periodic doping profiles (symmetric or asymmetric) using high-energy ion implantation, to fabricate nanoimplant masters, to deposit nanoscale features, or to provide for nanoscale etching of device layers.

In an exemplary embodiment, the inventive method comprises fabricating a high aspect ratio structure in photoresist or other device layers using a multilayer approach based on either conventional photolithography or electron beam lithography and ballistic reactive ion etching at one or more angles. According to the inventive method, low-pressure RIE is used to pattern nanometer-scale angled sidewalls and three-dimensional structures in photoresist or directly into a device layer. At low pressures, plasma has a large dark space region where the etchant ions have very large, highly directional mean free paths. Placing the sample entirely within this dark space allows for etching at angles relative to the cathode with minimal undercutting, resulting in high-aspect ratio nanometer-scale angled features. The method can be applied to wafer-scale fabrication and enables production of three-dimensional mask profiles that can be used as masks for ion implantation, as well as formation of MEMS devices, and patterning of materials such as complex oxides used as high-temperature superconductors, SQUID arrays, manganites or other magnetoresistive materials.

According to one embodiment of the invention, a multi-layer masking structure is formed on a substrate material. In an exemplary embodiment for use in creation of ion implant profiles, three layers are used, including a photoresist as the base layer, a layer of germanium (Ge) on top of the base layer, and electron beam lithography (EBL) resist as the top layer. The uppermost layer is patterned using EBL after which the structure and substrate are subjected to dry etching in chlorine-based plasma to remove the exposed Ge. Because the EBL resist is also etched in the chlorine plasma, the initial thickness of the top layer must be such that sufficient thickness remains during this etch step to protect the Ge layer. The patterned substrate is then placed within the dark space of a low-pressure oxygen plasma etcher at an angle relative to the RIE sample plate to achieve the desired etch angle. The Ge layer, which is not etched in $O_2$ plasma, acts as a mask for the underlying photoresist. In the dark space, the ions are ballistic and, therefore, highly directional and able to produce high aspect ratio trenches. The oxygen plasma selectively removes the base layer of photoresist, exposing the areas of the substrate to be implanted.

In one aspect of the invention, a process for forming a trench structure in a target material includes the steps of forming a masking layer onto the target material on a substrate, wherein the target material is removable using a reactive ion etch in a plasma etch gas and wherein the masking layer comprises a material having high selectivity to the etch gas; forming a pattern in the masking layer to expose portions of the target material; positioning the substrate on an angle mount at a pre-determined angle relative to a cathode of a reactive ion etcher so that the target material is within a plasma dark space of the plasma etch gas; and etching the exposed portions of the target material using ballistic ions within the plasma dark space for a sufficient period of time to form an angled trench structure having a desired depth. The process may further include repeating the steps of positioning the substrate and etching the exposed portions of the target material with the substrate disposed at a different angle to define a triangular structure. In some embodiments, the target material may be a photoresist and the plasma etch gas may be oxygen. The masking layer may be germanium and the step of forming a pattern in the masking layer includes applying a layer of photoresist over the germanium; forming a pattern in the photoresist to expose portions of the germanium; and etching through the exposed germanium to expose portions of the target material. The exposed germanium may be etched using a chlorine plasma etch. The different angle may be the reverse of the pre-determined angle so that the triangular mask comprises an array of isosceles triangles. The different angle may be a zero degree angle so that the triangular mask has a sawtooth pattern.

In another aspect of the invention method for creating an angled profile in a target layer on a substrate includes applying a masking layer over the target layer, where the masking layer comprises a material having high selectivity to a plasma etch gas adapted for etching the target layer; applying a layer of lithography resist over the masking layer; forming a pattern in the lithography resist to expose portions of the masking layer; etching through the exposed masking layer to expose portions of the target layer; mounting the substrate on an angled mount having a pre-determined angle; positioning the substrate on the angled mount within a plasma dark space of a reactive ion plasma etcher using the plasma etch gas adapted for etching the target layer; and etching at least a portion of the target layer to define one or more angled trenches within the target layer. Additional steps may include repeating the steps of positioning the substrate and etching at least a portion of the target layer with the substrate disposed at a different angle to define a triangular structure. Where the different angle is the reverse of the pre-determined angle, the triangular structure will be an array of isosceles triangles. Wherein the different angle is a zero degree angle, the triangular structure will be a sawtooth pattern. In some embodiments, the target material is a photoresist and the plasma etch gas is oxygen. The masking layer may be germanium and the step of forming a pattern in the masking layer includes applying a layer of photoresist over the germanium; forming a pattern in the photoresist to expose portions of the germanium; and etching through the exposed germanium to expose portions of the target material. The exposed germanium may be etched using a chlorine plasma etch.

The invention provides a process for creating high aspect ratio masks for use in forming asymmetric doping profiles or nanoscale features (etched or deposited.) The inventive process can be performed using adapted, existing and commercially-available technology, i.e., reactive ion etching (RIE) tools. RIE tools are commonly used for wafer-scale dry etching application but are typically limited to either undirected substrate etching, or directed substrate etching that is perpendicular to the surface. The inventive process provides the ability to perform directed etching at an arbitrary angle to the substrate, with a range of applications that have previously been impossible or complicated (i.e. time-consuming and/or costly) to realize. In one application, the process can be exploited to create angled ion implant masks that can be used to produce a gradient in doping of the substrate (small or wafer-level) on a nanometric scale. Other applications include creation of MEMS structures, patterning of microbridge junctions for SQUIDs, and other superconducting or magnetoresistant devices.

The angled trenches formed according to the inventive method create an approach to producing nanoscale features using micron scale patterning techniques. By using this approach, nanoscale capabilities are placed within the reach of existing fabrication processes and instrumentation.

Accordingly, in another aspect of the invention, a mask is provided for creating nanoscale features from a stream of molecules or ions, where the mask comprises a high aspect ratio trench defined in a masking material deposited on a substrate, wherein the trench has a trench width, a trench bottom and a non-zero angle relative to the substrate; wherein molecules or ions impinging on the mask at an angle normal to the substrate are partially blocked by the mask so that an area of the trench bottom smaller than the trench width is impacted by the molecules or ions.

BRIEF DESCRIPTION OF THE DRAWINGS

FIGS. 1A-1D diagrammatically illustrate the basic process steps according to the invention, where

DETAILED DESCRIPTION

The following detailed description describes the preparation of high-aspect ratio masks for use in providing nanoscale-level control of ion implant profiles, in which the mask layer materials are selected for use in ion implant applications. It will be readily apparent to those of skill in the art that the materials selected for the mask layers may be varied depending on the application. For example, masks for fabrication of MEMS structures or SQUID arrays may be constructed from different materials than might be used in conventional semiconductor fabrication processes. As such, the examples, as well as alternative materials that may be suggested throughout the description, are not intended to be limiting.

The inventive process utilizes a multi-layer structure in combination with etching in the plasma dark space of a low-pressure reactive ion etch plasma to produce high aspect-ratio trenches at the nanoscale level. An exemplary process flow is shown in FIGS. 1A-1D and FIGS. 2A-2G.

Figure 1A:
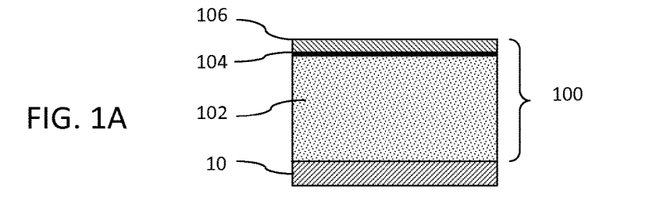
FIG. 1A shows the multi-layered structure.
Figure 1B:
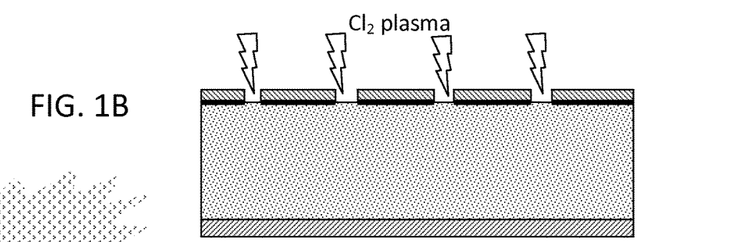
FIG. 1B shows the chloride plasma etch step.

Referring first to FIGS. 1A-1D, the basic elements of the multi-layer 100 begin with a coating of cured photoresist (PR) 102 or other appropriate masking layer on a substrate 10, a layer of germanium (Ge) 104 or other thin film oxygen-plasma resistant material, evaporated on top of the PR and a layer of lithography resist 106 on top, as shown in FIG. 1A. Alternative thin films that may be used as the oxygen-plasma resistant layer include vacuum or physical vapor depositable materials such titanium (Ti), silicon nitride ($Si_3N_4$), silicon (Si), silicon-germanium (SiGe), combinations thereof, or other materials that exhibit high selectively to oxygen plasma, etch relatively quickly in other plasma gases, e.g., $Cl_2$, and can act as an effective mask material without introducing undesirable elements such as dopants or contaminants into the overall process. Another important feature of the oxygen-plasma resistant material is that the deposition method should not damage the base masking layer 102.

Figure 1C:
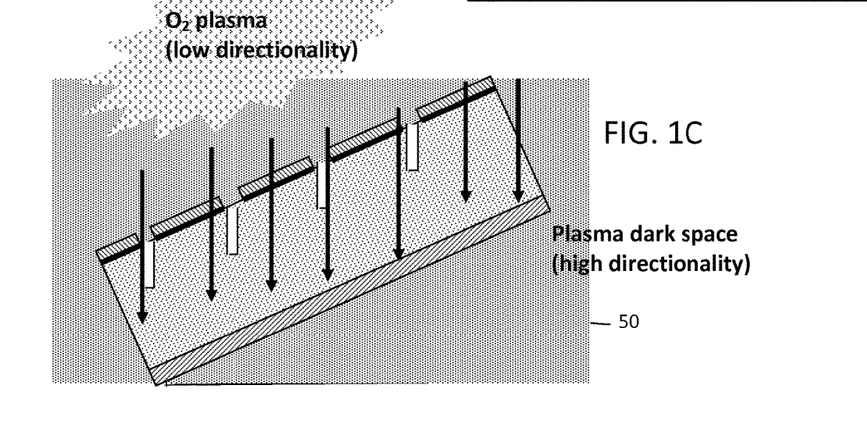
FIG. 1C shows the oxygen plasma etch step.
Figure 1D:
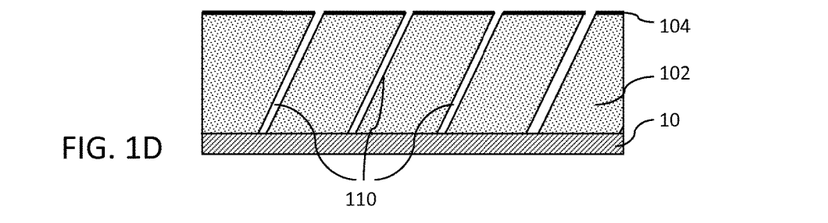
FIG. 1D shows an example of the resulting array.

The upper layer 106 may be patterned using conventional high-resolution patterning techniques such as optical lithography, including projection, contact and direct writing methods such as laser direct writing, electron beam lithography (EBL), or focused ion beam (FIB) lithography to protect selected areas of the Ge layer 104. The structure is subjected to a chlorine plasma etch, shown in FIG. 1B. The resulting patterned Ge acts as a mask to selectively protect the lower layer of PR 102 during a low-pressure oxygen plasma etch in which the substrate is placed on a triangular sample holder 50 positioned at an arbitrary angle within the plasma dark space (FIG. 1C). FIG. 1D provides an example of the resulting array of inclined trenches 110 in the PR 102 that may be used during an ion implant operation to produce controlled doping profiles. An exemplary system for performing the etching processes is a load-locked PLASMA-LAB® 100 RIE system, which is available from Oxford Instruments (UK). For RIE etching, typical process pressures will be in the range of 5 to 150 mTorr with a 13.56 MHz driven parallel plate reactor. As will be apparent to those in the art, other RIE etching systems may be used.

FIGS. 2A-2G provide a detailed process flow beginning with the formation of a multi-layer masking structure on top of a substrate 10. Formation of deep trenches in PR may be used for ion implant profiles, however, the inventive process is not limited to such applications, and may be applied to form trenches in other materials by combining the multi-layer mask steps with angled positioning of the sample within the plasma dark space of a low pressure RIE plasma etch gas. In general, the multi-layer structure will include a material into which trenches are to be formed, which, for purposes of clarity will be referred to as the "target material". The characteristics of the target material is that it is etchable in the plasma dark space of a low pressure RIE plasma etch gas, and has a thickness that is much greater than the width of the trenches to be formed. The mask layer is a material that is highly resistant to the gas that is used to etch the target material, while still being subject to processing for forming a pattern in the mask layer. Typically, the mask layer may be deposited and patterned under conditions that do not degrade the target layer. For example, the mask layer should be evaporated, sputtered or otherwise deposited at a temperature that is easily tolerated by the target material. The mask layer will preferably be thin relative to the target material and may be patterned using any conventional lithographic or patterning method. Thickness of the mask layer will be determined by the relative selectivity between the target material and the mask material, with a high degree of selectivity being preferred. To provide an example beyond the exemplary embodiments, the target material may be a magnetic or magnetoresistant material, while the mask material may be tantalum (Ta), tantalum nitride (TaN), ruthenium tantalum (Ru/Ta), titanium (Ti), or other materials known to have high selectivity to RIE etch gases such as $CH_3OH$, CO and/or $NH_3$. Another example is where the target material is silicon and the mask material is germanium or silicon-germanium (SiGe), where selectivity can be better than 1:100 in a low pressure $SF_6/O_2$ RIE plasma etch. In all cases, the sample is placed on an angled mount on the RIE plate so that the target material is located entirely within the plasma dark space.

Substrate 10 may be a conventional semiconductor material, e.g., silicon, silicon-germanium, silicon-on-sapphire (SOS), compound semiconductors, e.g., III-V materials, or other materials that are appropriate for use in fabrication of microelectronic, nanoelectronic, and MEMS devices, thin film high-temperature superconductors such as $YBa_2Cu_3O_{7-\delta}$ on sapphire, or a magnetoresistant material, such as manganite (e.g., $MgB_2$ on silicon carbide), as long as the substrate material is compatible with the photoresist that is used.

Figure 2A:
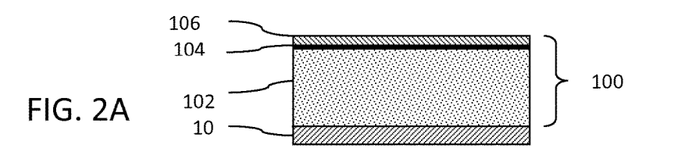
FIGS. 2A-2G diagrammatically illustrate the process flow for creating a doping profile according to the invention.

Returning to the illustrative example of forming high aspect ratio trenches in photoresist, a multi-layer mask structure is built on the substrate material 10 as initial step (FIG. 2A). This trilayer consists of a 0.3 μm-5 μm thick hard-baked Shipley photoresist layer 102, a ~30 nm evaporated Germanium (Ge) layer 104, and 120 nm of the commonly-used electron beam lithography (EBL) resist PMMA 106. (polymethylmethacrylate) 106. In initial testing, substrate 10 was a 500 μm thick n-type doped silicon wafer piece. As noted above, the Ge protective layer may be replaced with another thin film as appropriate for the device and materials under fabrication, and the upper layer resist 106 may be changed as appropriate to the type of lithographic technique used to pattern the resist. Alternative lithographic techniques include optical lithography, direct write laser lithography, focused ion beam lithography, and other patterning methods as are known in the art. Because the general principles and procedures for lithography are well known, details of conventional steps such as exposing, developing, curing, baking and rinsing are not described herein.

Figure 2B:
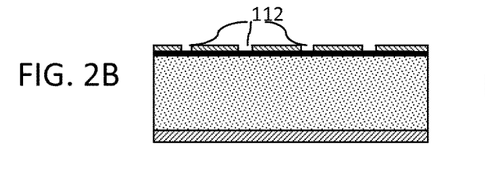
Figure 2C:
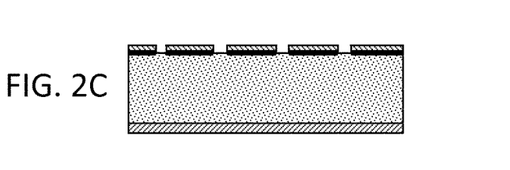

In the next step shown in FIG. 2B, the top-most PMMA layer 106 (1.6 μm thick in the test structure) is patterned by EBL (or other conventional lithography technique known in the art.) A periodic array of long (up to several inches), parallel fine lines 112 is transferred into the PMMA resist. Depending on the final ion implant mask, this typically consists of a series of long (up to several inches), parallel fine lines. The line width is small (5 nm-100 nm). For testing, a line spacing of 1 μm was used, but in principle any line spacing is possible.

In the next step (FIG. 2C), the patterned trilayer is subjected to an anisotropic etch process to selectively remove the Ge metallic layer in the areas exposed by the previous step. In the preferred embodiment, the anisotropic etch step was achieved using a dry etch process in a chlorine plasma While PMMA is also etched in the chlorine plasma, the relatively thin Ge layer allows for a short etching time which ensures that about two-thirds of the initial PMMA film is still present after this RIE step, effectively protecting any underlying germanium. Note that the thickness of the Ge layer 104 can be greater or less than 30 nm as long as the top layer 106 has sufficient thickness so that a protective layer remains following the $Cl_2$ plasma etch step.

Figure 2D:
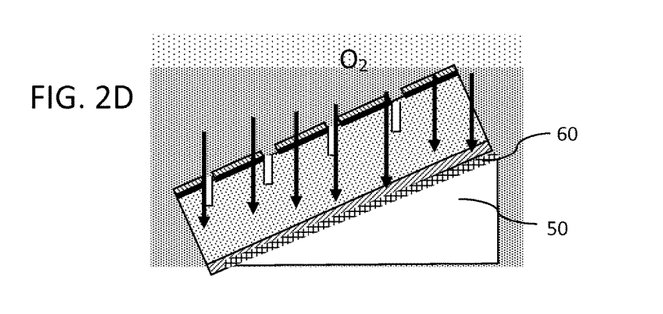

FIG. 2D illustrates the step in which trenches are etched into the photoresist layer 102 on top of the substrate. The substrate 10 is tilted at an arbitrary angle relative to the RIE sample plate (i.e., the cathode)) in a RIE low-pressure (~5 mTorr) oxygen plasma by using a small triangular mount 50. The substrate is adhered to the mount 50 using a thermal compound 60, which may be a mixture of APIEZON® N grease and DOW CORNING® 340 heat sink compound. The substrate is positioned within the plasma dark space, where the ballistic ions impinge upon the PR 102 with a high degree of directionality, perpendicular to the RIE sample plate. As the Ge layer 104 is not etched in the $O_2$ plasma, it provides a protective layer for the underlying photoresist 102. Depending on the RIE system and parameters used, the plasma dark space can be several inches high, allowing for processing of large wafers. An RIE system used for practicing the inventive method may incorporate a tilting stage, which may be motorized, for convenient selection of an arbitrary angle to the plasma. The etch process may be continued all the way to the bottom of the photoresist layer 102 or, may be stopped at any etch depth. Whether or not the entire thickness of PR is removed will depend on a number of factors including the angle to be etched, the photoresist thickness, the ion implant parameters, and the final profile to be created.

Figure 2E:
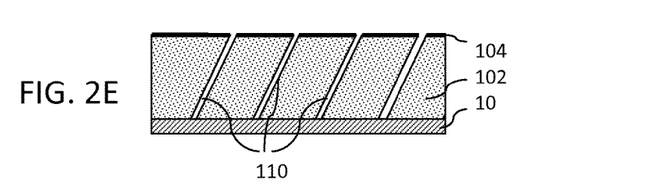

FIG. 2E shows the resulting high aspect-ratio trenches 110 following the low-pressure oxygen plasma etch.

Figure 2F:
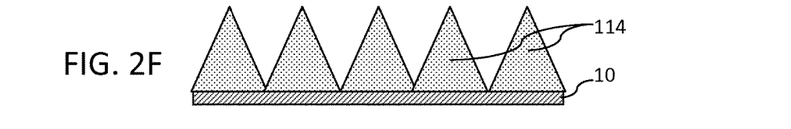

FIG. 2F provides an example of how reversing the initial angle and repeating the low-pressure oxygen plasma etch can create a triangle mask. In this example, the same angle was used for both etch steps, producing an array of isosceles triangles. As will be readily apparent to those in the art, different combinations of the two angles chosen during $O_2$ etch steps can be used to produce different mask profiles, such as scalene triangles. Right triangles can be formed by selecting a zero degree tilt during the second etch step to produce a sawtooth masking pattern.

Figure 2G:
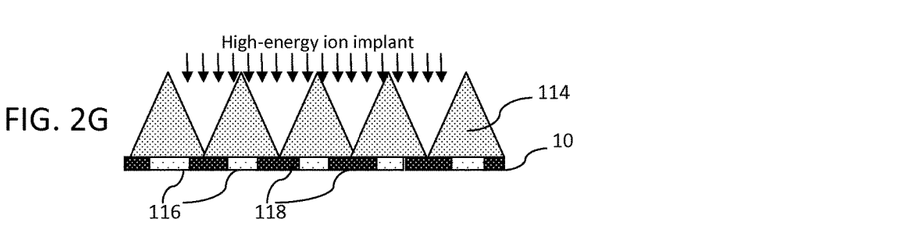

As illustrated in FIG. 2G, during final ion implanting, thicker mask regions 114 will block incident ions from reaching the substrate and, therefore, result in low or no doping, which is indicated by the lighter areas 116 in the substrate 10. Thinner mask regions will enable a high level of substrate doping, which is designated by the darker areas 118 in the substrate. The final doping profile can further be adjusted by using different implant angles, implant energies, and implant ion species. The mask may be stripped using acetone or another appropriate commercially-available PR stripping formulation. The sample may then be annealed, if desired, to diffuse the doping.

Figure 3:
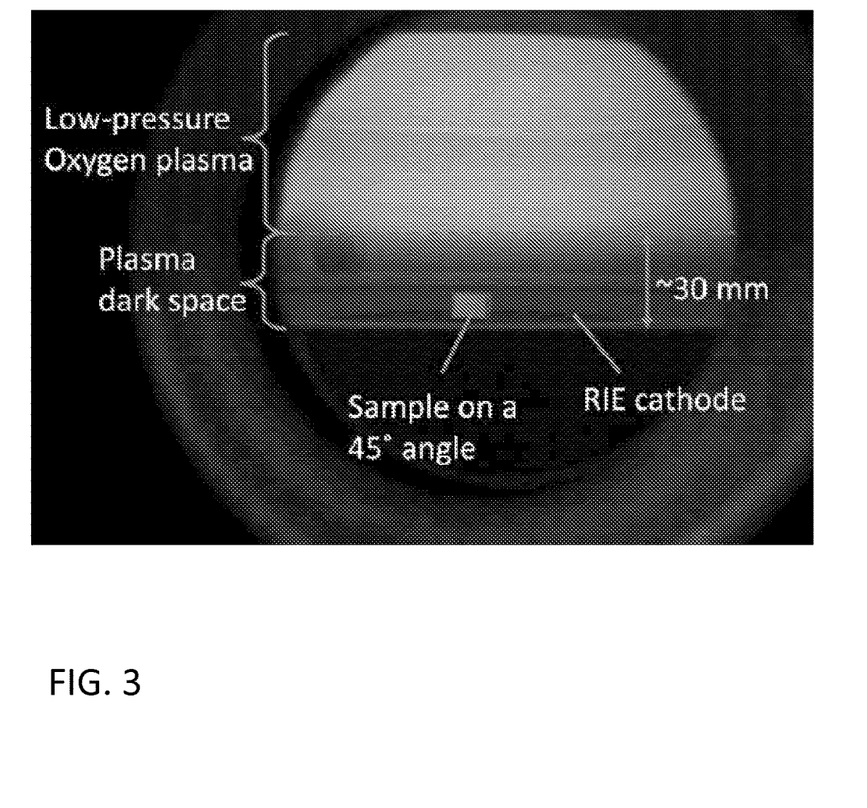
FIG. 3 is an optical photographic showing a sample being etched in the plasma darkspace.

It is important to note that the substrate must be located entirely within the dark space of the plasma during the oxygen etch step. Only in the dark space region is the plasma highly directional and, therefore, capable of producing high aspect-ratio trenches. FIG. 3 is a photograph of the etching process taken through the window of an exemplary RIE system. The plasma dark space and the location of the sample are clearly visible and are indicated in the image, with the low-pressure oxygen plasma at the top and the plasma dark space at the bottom as seen through the viewport window. The sample shown in FIG. 3 is supported on a 45° custom-made aluminum angle base, which is located entirely within the dark space which, in this case, has a height of about 30 mm.

Several different right angle sample holders were fabricated by machining small triangular aluminum sample mounts consisting of a single inclined surface. (See, e.g., FIG. 2D.) The heights of the wedges were kept small to ensure that they were entirely within the dark space of the plasma. The sample mounts ranged between 4.7 and 8 mm for the various angles. The samples were attached to the sloped surfaces of the mounts using a thermal compound consisting of a 1:1 mixture of APIEZON® N grease and DOW CORNING® 340 heat sink compound and placed on the RIE sample plate. The germanium was etched at room temperature in 25 mTorr of $CCl_2F_2$ gas. In some tests, the etch step was performed at 50 W for 100 seconds; in others the conditions were 70 W for 30 minutes. No external bias was applied; the plasma DC self-bias was 300V.

With the sample still mounted on the sample mount, oxygen etches of the exposed PR were performed in the plasma dark space of a low pressure oxygen plasma at room temperature at a pressure of 4 mTorr at 100 W for 900 seconds. No external bias was applied and the plasma DC self-bias was 300V.

The low plasma pressure ensured minimal undercutting, producing sub-30 nm wide etched trenches exhibiting a high aspect-ratio. It should be noted that the line width can easily be modified by changing the electron dose (i.e. the pixel dwell time) during electron beam lithography to form the line array in the upper PMMA layer 106.

For inspection, the etch profiles the silicon wafer pieces were cleaved perpendicular to the etched line array and mounted on a 90° scanning electron microscope (SEM) sample holder. This ensured that the cleaved surface would face the SEM pole piece, allowing cross-sectional images of the etched trenches could be recorded.

Figure 4A:
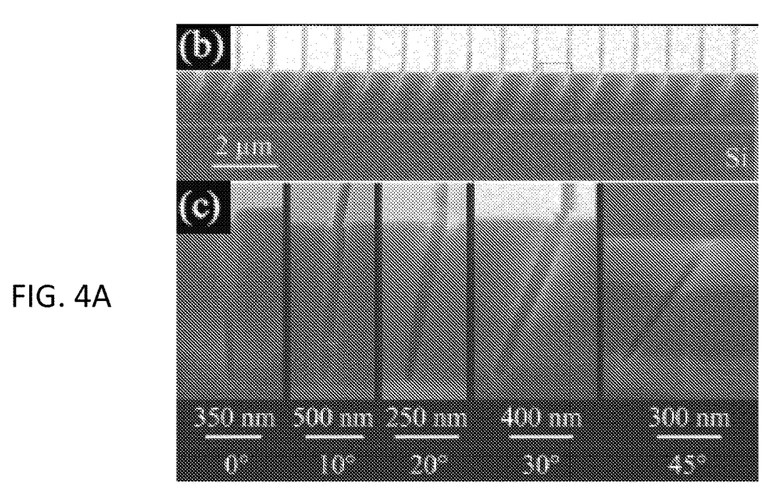
FIG. 4A shows cross-sectional SEM images of the cleaved surfaces after etching; with the lower portion of the image showing magnifications of individual trenches etches at different angles.
Figure 4B:
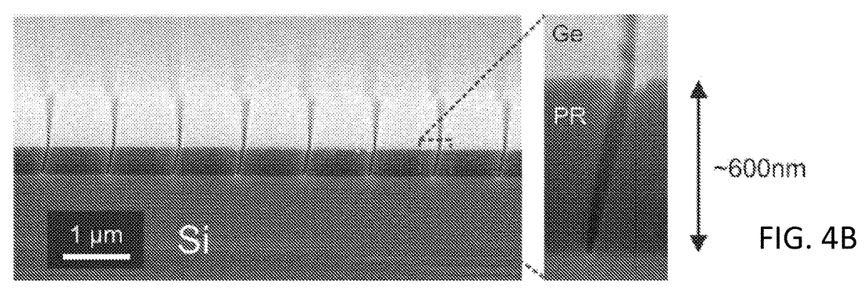
FIG. 4B shows cross-sectional SEM images of parallel etched trenches at 15 degree angle to the plasma, in a 600 nm thick photoresist (PR) layer, all the way down to the silicon (Si) substrate.
Figure 4C:
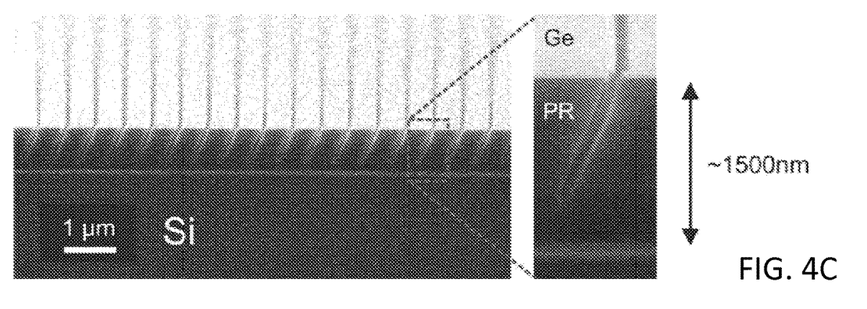
FIG. 4C shows cross-sectional SEM images of etched trenches at 25 degree angle to the plasma, in a 1500 nm thick photoresist (PR) layer.

FIG. 4A illustrates a typical cross-sectional image at near 90° viewing angle of a cleaved surface with an etched line array. The angle used during etching in this case was 30°. The etched trenches display a high degree of uniformity. Magnified images of individual etched trenches shown in the lower panel of FIG. 4A reveal that the angle of the substrate relative to the cathode during etching does not translate directly to the actual trench angle. This is in agreement with Coldren et al. (J. A. *J. Vac. Sci. Technol.* 1981, 19, 225) who also reported an offset between the angle during etching and the resulting angle. Regardless, there was no apparent difference in etch rate between any of the investigated angles. FIG. 4B shows cross-sectional SEM images of parallel etched trenches at 15 degree angle to the plasma, in a 600 nm thick photoresist (PR) layer, all the way down to the silicon (Si) substrate. The trench spacing is about 1000 nm. FIG. 4C shows cross-sectional SEM images of etched trenches at 25 degree angle to the plasma, in a 1500 nm thick photoresist (PR) layer, about 60% etched into the photoresist layer. The trench spacing is about 500 nm.

Figure 5:
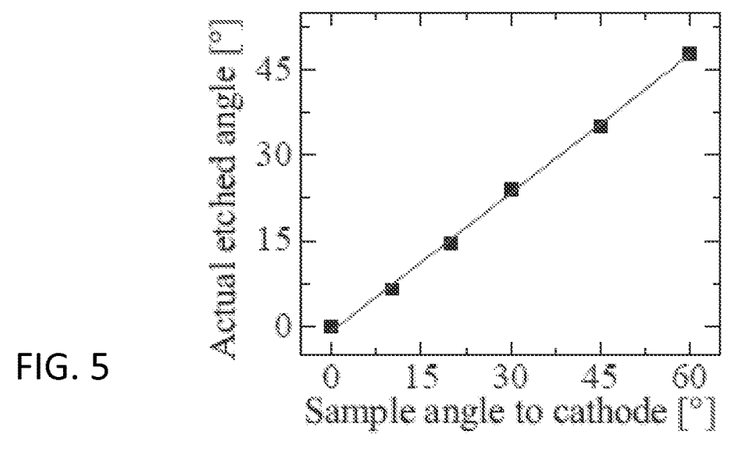
FIG. 5 is a plot of actual trench angle as a function of angle during etching.

FIG. 5 is a plot of the actual trench angle as a function of the angle of the substrate relative to the cathode during etching. Rather than a fixed angle offset, a linear dependence can be observed, showing a slope of 0.81. This would predict a theoretical maximum trench angle of 73°. It is not clear if this relation is generally valid or simply a property of the RIE system that was employed for testing the process. It is notable that there is no data in the literature on how this effect depends on process chemistry, substrates or etching parameters used.

In order to create three-dimensional mask profiles a second etch process using a different angle has to be performed. Additional lines perpendicular to the line array are one way to ensure successful lift-off of the photoresist after the second etch step. Also, focused ion beam tools may be used to cut off the edges of the line arrays.

Figure 6:
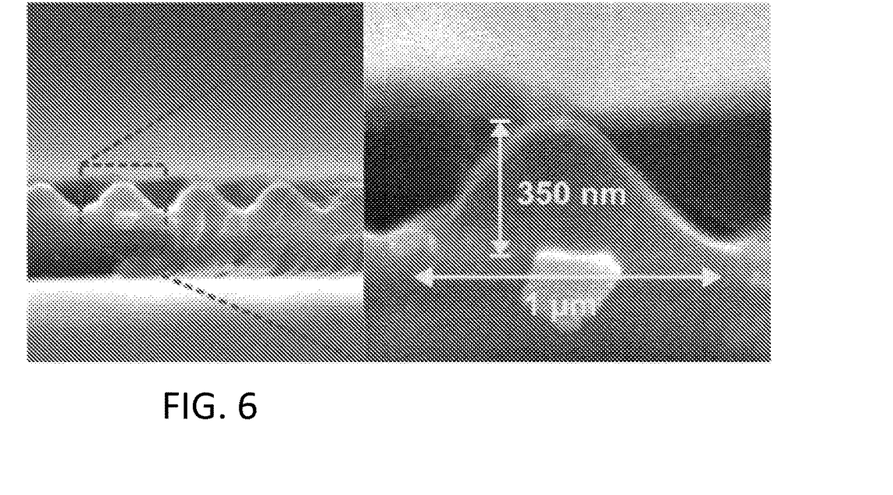
FIG. 6 is SEM images of a triangular mask after lift-off that has been created using a 60° angle to the RIE cathode.

A triangular mask profile can be created by reversing the initial angle and repeating the step shown in FIG. 2D to create the triangular masks shown in FIGS. 2F and 2G. An example of a fabricated triangular mask is shown in FIG. 6. This mask was created by using a 60° angle to the RIE sample plate and subsequently reversing this angle. As previously described, use of two different angles will produce different triangular shapes.

According to the present invention, a dry etch process using reactive ion etching is provided that is capable of creating sloped trenches and sidewalls. The desired nanoscale doping profile can be achieved by a low-pressure oxygen etch approach using a trilayer mask that is placed into the plasma dark space during processing. Arbitrary angles can be used although the actual etched angle is about 20% smaller than the angle between RIE cathode and sample during etching. By reversing the angle in a second low-pressure oxygen etch step it is possible to produce three-dimensional mask profiles which can be exploited to create doping profiles or masters for nanoimprint. Using different combinations of etched angles it is strongly assumed that different mask profiles can be achieved.

Figure 9:
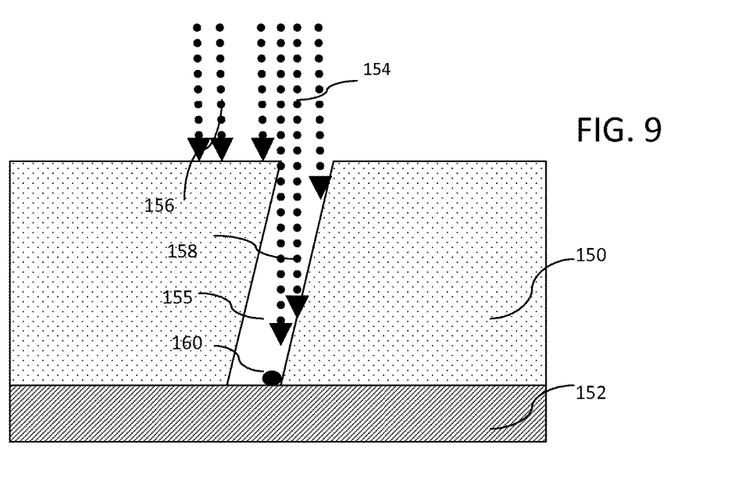
FIG. 9 is a diagrammatic view of an application of the inventive masking method for production of nanoscale features.

FIG. 9 diagrammatically illustrates how a trench formed according to the inventive method can be used in the formation of a feature that is much smaller than the actual trench width. As shown, the angled sidewalls of the trench 155 act as a partial barrier to streams of molecules or ions 154 impinging on the sample at a normal angle to the substrate. For example, streams of molecules 156 of material in an evaporation step will be prevented from entering the trench 155 where there is a partial overhang, while other streams of molecules 158 will be able to enter the trench 155 only in the portion of the trench that provides a straight path to the exposed area of substrate 152 at the bottom of the trench. The effective result is that a much smaller feature 160 can be produced at the bottom of the angled trench than if the masking structure 150 had been patterned with completely vertical sidewalls. Similarly, if the streams of molecules or ions 154 are actually ions of an etch gas during a reactive ion etch, only a small portion of the exposed area of the substrate 152 will be etched—much smaller than the total width of the trench 155. During an ion implant step, the area of the substrate that will be doped corresponds to the small area at the bottom of the trench that ions can reach via a straight line. The important advantage provided by this approach is that the angled trench can be made with a larger initial dimension employing the inventive method by way of conventional lithography methods, thus enabling nanoscale dimensions to be achieved while avoiding the need for costly instrumentation and patterning processes that would otherwise be required to produce such a nanoscale feature.

EXAMPLE

Fabrication of SQUID Array

The inventive process was used for fabricating arrays of nano-superconducting quantum interference devices (SQUIDs) using a high transition temperature ($T_C$) superconducting material such as $YBa_2Cu_3O_{7-\delta}$ ("YBCO"). Substrates consisted of 7×7 mm$^2$ 150 nm YBCO files on r-plane sapphire diced from 50.8 mm (2 inch) wafers. The YBCO films are covered by a 15 nm in-situ silver (Ag) film to ensure low contact resistance. In order to allow for robust wire-bonding with good adhesion, an additional 10-nm titanium sticking layer and 200 nm gold layer were sputtered ex-situ. The $T_C$ of an unpatterned film has been determined to be approximately 90 K.

Before patterning of the SQUID array and electrodes, each substrate was stripped of metal at the locations where the SQUID array is to be placed. This step is necessary to ensure that the high-energy ion-radiation used to form the Josephson junctions reaches the YBCO SQUID array without being scattered by the metal layer. (Otherwise, a higher high-energy dose would be required, and considerable broadening of the damaged area from lateral ion straggle could occur, resulting in low performance of the ion-damage Josephson junctions.)

In order to perform the metal removal step, 1.8 µm thick 9% 950 k PMMA in chlorobenzene (PMMA C9) electron beam resist was spun onto the substrates. The thick EBL resist is preferred over a thin resist because it is easier to strip the metal removal mask in a later step. The substrates are then patterned using electron beam EBL at a high electron beam current (>5 nA) to allow for a short exposure time. After development, an argon ion mill is used to remove the metal layer that is exposed through the PMMA C9 mask. Argon ion milling is preferred over the widely-used potassium iodide-potassium ($KI^+$-I) wet etch due to its anisotropic behavior (less undercut) and easy removal of the underlying titanium layer.

Fabrication of the SQUID array and electrode pattern is illustrated in FIGS. 7A-7D. A trilayer mask structure 120 is formed on the YBCO/sapphire substrate 122, consisting of, from the bottom up, a 1.6 μm hard-baked photoresist layer 124, 25 nm evaporated Ge 126, and a 120 nm layer of conventional PMMA C2 EBL resist 128. The PMMA layer was patterned by EBL performed using a RAITH50 EBL system. It should be noted that the entire device layout including electrodes, SQUID array and Josephson junction fine lines are written in this single exposure.

Figure 8:
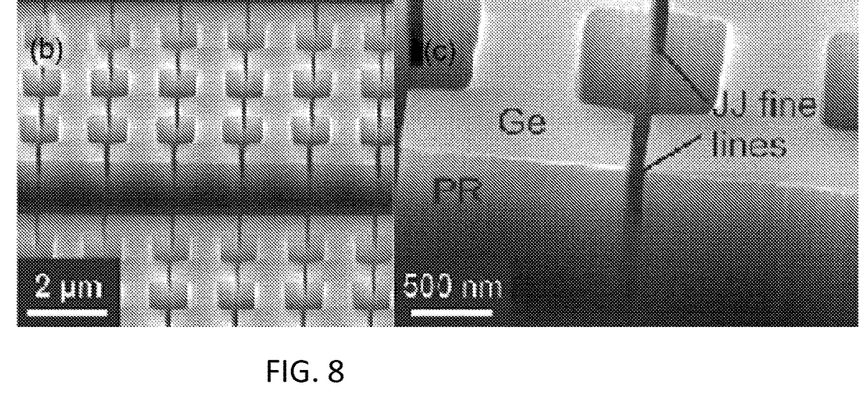
FIG. 8 shows two different SEM magnifications of a mask used in the fabrication of a SQUID array.

The samples were RIE etched in chlorine plasma to selectively remove the portions of the Ge layer that were not protected by the patterned PMMA 128. The sample was then exposed to low-pressure oxygen plasma with the sample positioned within the plasma dark space to produce high-aspect ratio trenches in the PR layer 124. FIG. 8 provides SEM images at different magnifications (2 μm (left) and 500 nm (left)) of the loops with the Josephson junctions (JJ) fine lines. After etching the mask, the thin Ge film on top of the thick PR layer is still intact.

Figure 7A:
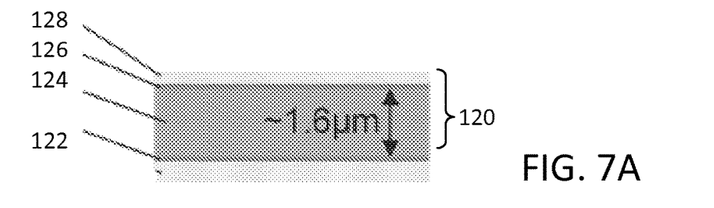
FIGS. 7A-7D illustrate the steps of an exemplary fabrication process for a SQUID array according to the present invention.
Figure 7B:
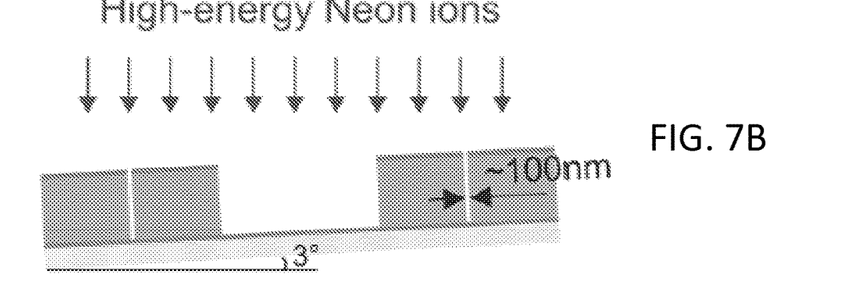
Figure 7C:
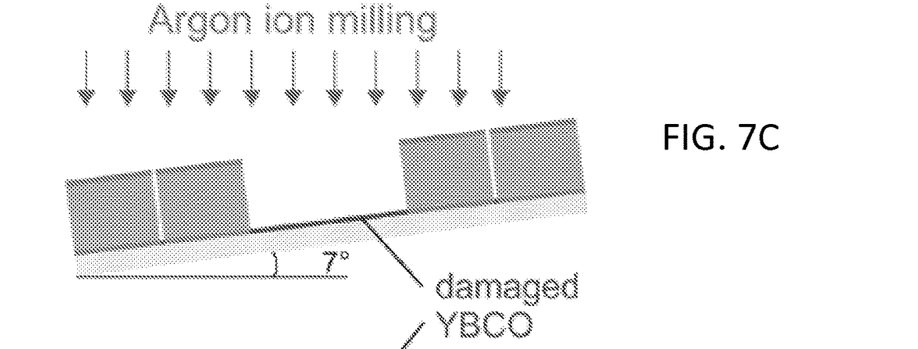
Figure 7D:
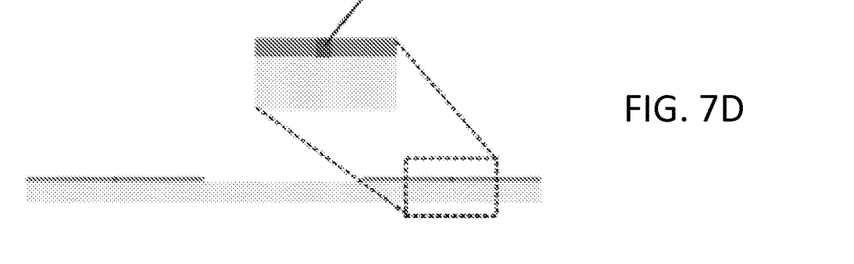

As shown in FIG. 7B, the creation of the Josephson junctions is performed by exposure to 200 keV Neon ions using a commercial ion implant system. For this step, the sample is positioned at a small angle (~3°) relative to the incident implant beam.

Argon ion milling is performed with the sample mounted at a 7° angle to the incident argon beam (FIG. 7C), which shadows the narrow junction trenches and only removes large features, e.g., loops, interconnects, electrodes, etc., in the YBCO film. The mask is stripped and the device is completed, shown in FIG. 7D, ready to be wire bonded and installed into a chip package.

The preceding detailed description provides an exemplary application as an illustration of the inventive method for creation of high aspect ratio trenches with arbitrary angles at nanoscale dimensions. While the examples provided relate to formation of trenches in photoresist which may be used for creation of doping profiles, the principles of the invention are applicable to formation of other micron and nanoscale structures in other materials, such as silicon and other semiconductors, superconducting materials and magnetoresistant materials that incorporate, or can be fabricated using high aspect ratio angled trenches, or for which such trenches may be used to create angled features, such as step-edge profiles.

REFERENCES

1. Takamori, T.; Coldren, L. A.; Merz J. L., "Angled etching of GaAs/AlGaAs by conventional Cl$_2$ reactive ion etching", *Appl. Phys. Lett.* 1988, 53, 2549.
2. Coldren, L. A.; Rentschler, J. A., "Directional reactive-ion-etching of InP with Cl$_2$ containing gases", *J. Vac. Sci. Technol.* 1981, 19, 225.
3. Tjerkstra, R. W.; Woldering, L. A.; Broek, J. M.; Roozeboom, F.; Setija, I. D.; Vos, W. L., "A method to pattern masks in two inclined planes for three-dimensional nano- and microfabrication", *J. Vac. Sci. Technol. B* 2011, 29, 061604
4. Jacobs, B.; Zengerle, R., "Reactive ion etching of sloped sidewalls for surface emitting structures using a shadow mask technique", *J. Vac. Sci. Technol. B* 1996, 14, 2537
5. Kim, J. M.; Carr, W. N.; Zeto, R. J.; Poli, L., "Reactive Ion Etching Techniques for Silicon Sidewall Angle Control in Microengineering", *J. Electrochem. Soc.* 1992, 139, 1700
6. Uhrmacher, M.; Pampus, K.; Bergmeister, F. J.; Purschke, D.; Lieb, K. P., "Energy calibration of the 500 kV heavy ion implanter ionas", *Nucl. Instrum. Meth. B* 1985, 9, 234
7. Schift, H., "Nanoimprint lithography: An old story in modern times? A review", *J. Vac. Sci. Technol. B* 2008, 26, 458
8. Chou, S. Y.; Krauss, P. R.; Renstrom, P. J., "Nanoimprint lithography", *J. Vac. Sci. Technol. B* 1996, 14, 4129
9. Chu, P. K.; Tang, B. Y.; Cheng, Y. C.; Ko, P. K., "Principles and characteristics of a new generation plasma immersion ion implanter", *Rev. Sci. Instrum.* 1997, 68, 1866
10. Cybart, S. A.; Anton, S. M.; Wu, S. M.; Clarke, J.; Dynes, R. C., "Very Large Scale Integration of Nano-patterned YBa$_2$Cu$_3$O$_{7-\delta}$ Josephson Junctions in a Two-Dimensional Array", *Nano Lett.* 2009, 9, 3581
11. Cybart, S. A.; Chen, K.; Cui, Y.; Li, Q.; Xi, X. X.; Dynes, R. C., "Planar MgB$_2$ Josephson junctions and series arrays via nanolithography and ion damage", *Appl. Phys. Lett.* 2006, 88, 012509

The invention claimed is:

1. A method for forming a nanoscale feature in a device substrate, comprising:
   creating a mask in a target material, comprising:
   forming a masking layer on the target material on a substrate, wherein the target material is removable using a reactive ion etch in a plasma etch gas and wherein the masking layer comprises a material having a lower etch rate using the etch gas than the etch rate of the target material in the same etch gas;
   forming a pattern in the masking layer to expose portions of the target material;
   positioning the substrate on an angle mount at a pre-determined angle relative to a cathode of a reactive ion etcher so that the target material is within a plasma dark space of the plasma etch gas; and
   etching the exposed portions of the target material using ballistic ions within the plasma dark space for a sufficient period of time to form an angled trench structure having a trench width and a trench depth;
   disposing the mask on the device substrate; and
   exposing the mask and device substrate to a stream of molecules or ions to form a device feature in the device substrate at an exposed area corresponding to a portion of the angled trench structure that provides a straight path to the device substrate, wherein the exposed area has an exposed width that is smaller than the trench width.

2. The method of claim 1, further comprising repeating the steps of positioning the substrate and etching the exposed portions of the target material with the substrate disposed at a different angle to define a triangular structure.

3. The method of claim 2, wherein the different angle comprises the reverse of the pre-determined angle so that the triangular structure comprises an array of isosceles triangles.

4. The method of claim 2, wherein the different angle comprises a zero degree angle so that the triangular structure comprises a sawtooth pattern.

5. The method of claim 1, wherein the target material is a photoresist and the plasma etch gas is oxygen.

6. The method of claim 1, wherein the masking layer is germanium and the step of forming a pattern in the masking layer comprises:

applying a layer of photoresist over the germanium;
patterning the photoresist to expose portions of the germanium; and
etching through the exposed germanium to expose portions of the target material.

7. The method of claim 6, wherein the germanium is evaporated onto the target material.

8. The method of claim 6, wherein the step of etching the exposed germanium comprises performing a chlorine plasma etch.

9. The method of claim 6, wherein the photoresist has a thickness wherein at least a portion of the photoresist remains after etching the exposed germanium.

10. The method of claim 1, wherein the step of forming a pattern in the masking layer comprises:
applying a layer of photoresist over the masking layer;
patterning the photoresist to expose portions of the masking layer; and
etching through the exposed masking layer to expose portions of the target material.

11. The method of claim 10, wherein the step of patterning comprises using a lithography method selected from the group consisting of optical lithography, laser lithography, electron beam lithography, and focused ion beam lithography to expose the photoresist.

12. The method of claim 10, wherein the masking layer is selected from the group consisting of germanium, titanium, silicon nitride, silicon, silicon-germanium, and combinations thereof.

13. The method of claim 1, wherein the step of mounting the substrate on the angle mount comprises applying a thermal compound to the angle mount.

14. A method for forming a nanoscale feature in a device substrate, comprising:
creating an angled profile in a target layer on a substrate, comprising:
applying a masking layer over the target layer, wherein the masking layer comprises a material having a lower etch rate in a reactive ion plasma etch gas than the etch rate of the target layer in the same plasma etch gas;
applying a layer of lithography resist over the masking layer;
forming a pattern in the lithography resist to expose portions of the masking layer;
etching through the exposed masking layer to expose portions of the target layer;
mounting the substrate on an angled mount having a pre-determined angle;
positioning the substrate on the angled mount within a plasma dark space of a reactive ion plasma etcher using the plasma etch gas adapted for etching the target layer; and
etching at least a portion of the target layer using ballistic ions within the plasma dark space to define one or more angled trenches having trench widths within the target layer;
disposing the mask on the device substrate; and
exposing the mask and device substrate to a stream of molecules or ions to form device features in the device substrate at exposed areas corresponding to portions of the one or more angled trenches that provide a straight path to the device substrate, wherein the exposed areas have exposed widths that are smaller than the trench widths.

15. The method of claim 14, further comprising repeating the steps of positioning the substrate and etching at least a portion of the target layer with the substrate disposed at a different angle to define a triangular structure.

16. The method of claim 14, wherein the different angle comprises the reverse of the pre-determined angle so that the triangular structure comprises an array of isosceles triangles.

17. The method of claim 14, wherein the different angle comprises a zero degree angle so that the triangular structure comprises a sawtooth pattern.

18. The method of claim 14, wherein the step of mounting the substrate on the angle mount comprises applying a thermal compound to the angle mount.

19. The method of claim 14, wherein the target layer is photoresist, and further comprising curing the photoresist prior to applying the masking layer.

20. The method of claim 14, wherein the masking layer is germanium.

21. The method of claim 20, wherein the germanium is evaporated onto the target layer.

22. The method of claim 20, wherein the step of etching the exposed masking layer comprises performing a chlorine plasma etch.

23. The method of claim 14, wherein the masking layer is a material selected from the group consisting of germanium, titanium, silicon nitride, silicon, silicon-germanium, and combinations thereof.

24. The method of claim 14, wherein the lithography resist has a thickness wherein at least a portion of the lithography resist remains after etching the exposed masking material.

25. The method of claim 14, wherein the step of forming a pattern comprising performing electron beam lithography.

26. The method of claim 14, wherein the step of forming a pattern comprises performing a lithographic process selected from the group consisting of optical lithography, laser lithography, electron beam lithography, and focused ion beam lithography to expose the resist.

* * * * *